(12) United States Patent
Ichino et al.

(10) Patent No.: US 9,165,763 B2
(45) Date of Patent: *Oct. 20, 2015

(54) COATING TREATMENT METHOD

(71) Applicant: Tokyo Electron Limited, Tokyo (JP)

(72) Inventors: Katsunori Ichino, Koshi (JP); Koji Takayanagi, Koshi (JP); Tomohiro Noda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

This patent is subject to a terminal disclaimer.

(21) Appl. No.: 13/934,282

(22) Filed: Jul. 3, 2013

(65) Prior Publication Data
US 2013/0295777 A1    Nov. 7, 2013

Related U.S. Application Data

(62) Division of application No. 12/855,259, filed on Aug. 12, 2010, now Pat. No. 8,501,274.

(30) Foreign Application Priority Data

Aug. 27, 2009 (JP) .................................. 2009-196331
Jul. 1, 2010 (JP) .................................. 2010-150740

(51) Int. Cl.
*B05D 3/12* (2006.01)
*H01L 21/02* (2006.01)
*G03F 7/16* (2006.01)
(Continued)

(52) U.S. Cl.
CPC .......... *H01L 21/02282* (2013.01); *G03F 7/162* (2013.01); *H01L 21/6715* (2013.01); *B05D 1/005* (2013.01)

(58) Field of Classification Search
CPC ...... H01L 21/6715; G03F 7/162; B05D 1/005
USPC .................................. 427/240, 425; 438/782
See application file for complete search history.

(56) References Cited

U.S. PATENT DOCUMENTS 5,405,813 A    4/1995    Rodrigues
5,912,049 A    6/1999    Shirley
(Continued)

FOREIGN PATENT DOCUMENTS

JP    10-151407 A    6/1998
JP    11-016810 A    1/1999
(Continued)

OTHER PUBLICATIONS

Office Action issued from the Japanese Patent Office mailed Mar. 5, 2013 in corresponding JP patent application No. 2010-150740.

*Primary Examiner* — Kirsten Jolley
(74) *Attorney, Agent, or Firm* — Posz Law Group, PLC

(57) ABSTRACT

A substrate is rotated at a first rotation number (first step). The rotation of the substrate is decelerated to 1500 rpm that is a second rotation number and the substrate is rotated at the second rotation number for 0.5 seconds (second step). The rotation of the substrate is further decelerated to a third rotation number and the substrate is rotated at the third rotation number (third step). The rotation of the substrate is accelerated to a fourth rotation number and the substrate is rotated at the fourth rotation number (fourth step). A resist solution is continuously supplied to a center portion of the substrate from a middle of the first step to a middle of the third step.

3 Claims, 18 Drawing Sheets

(51) Int. Cl.
*H01L 21/67* (2006.01)
*B05D 1/00* (2006.01)

(56) References Cited

U.S. PATENT DOCUMENTS

| | | |
|---|---|---|
| 6,890,595 B2 | 5/2005 | Lee et al. |
| 2007/0092643 A1 | 4/2007 | Yoshihara et al. |
| 2008/0069948 A1 | 3/2008 | Yoshihara et al. |
| 2009/0087559 A1 | 4/2009 | Yoshihara et al. |
| 2009/0226615 A1 | 9/2009 | Nakazawa |
| 2010/0112209 A1 | 5/2010 | Yoshihara et al. |
| 2010/0209607 A1 | 8/2010 | Takayanagi et al. |

FOREIGN PATENT DOCUMENTS

| | | |
|---|---|---|
| JP | 2007-115907 A | 5/2007 |
| JP | 2007-115936 A | 5/2007 |
| JP | 2008-071960 A | 3/2008 |
| JP | 2009-078250 A | 4/2009 |
| WO | 2008/111400 A1 | 9/2008 |

# COATING TREATMENT METHOD

CROSS REFERENCE TO RELATED APPLICATIONS

This application is a divisional of U.S. application Ser. No. 12/855,259 filed on Aug. 12, 2010, which is based on, claims priority to and incorporates herein by reference Japanese Patent Application No. 2009-196331 filed on Aug. 27, 2009 and No. 2010-150740 filed on Jul. 1, 2010.

BACKGROUND OF THE INVENTION

1. Field of the Invention

The present invention relates to a coating treatment method of applying a coating solution on a substrate, a computer-readable storage medium, and a coating treatment apparatus.

2. Description of the Related Art

For example, in a photolithography process in manufacturing processes of a semiconductor device, resist coating treatment for forming a resist film by applying a resist solution on, for example, a semiconductor wafer (hereinafter, referred to as a "wafer"), exposure processing for exposing the resist film to a predetermined pattern, developing treatment for developing the exposed resist film, and so on are sequentially performed, whereby a predetermined resist pattern is formed on the wafer.

In the aforesaid resist coating treatment, often used is a so-called spin coating method of applying a resist solution on the wafer by supplying the resist solution from a nozzle to a center portion of the rotated wafer and diffusing the resist solution on the wafer by a centrifugal force.

As a method of uniformly applying a small amount of resist solution in this spin coating method, the following coating treatment method of executing a first step to a third step has been proposed. First, in the first step, the resist solution is supplied to the center portion of a wafer which is rotated at high speed at a first rotation number and diffused on the wafer. In this first step, the resist solution is not diffused to the end of the wafer yet because the amount of the resist solution supplied on the wafer is small. Subsequently, in the second step, the rotation of the wafer at low speed is once decelerated to a second rotation number, and the supply of the resist solution in the first step is continuously performed to improve the fluidity of the resist solution on the wafer. Thereafter, the supply of the resist solution in the second step is stopped, and the rotation of the wafer is then accelerated to a third rotation number to diffuse the resist solution over the entire front surface of the wafer to thereby apply the resist solution on the wafer (see Japanese Patent Application Laid-open No. 2008-71960).

SUMMARY OF THE INVENTION

However, when using the above-described conventional method, the contact angle of the surface of the resist solution on the wafer is large in the first step due to the additive contained in the resist solution. Further, because of the rotation of the wafer at high speed at the first rotation number, the resist solution on the wafer dries and the fluidity of the surface of the resist solution decreases. Therefore, when the resist solution is supplied to the wafer which is rotated at low speed at the second rotation number in the second step subsequently performed, the resist solution previous supplied on the wafer in the first step does not fit in the resist solution supplied on the wafer in the second step. Thus, when the resist solution is diffused on the wafer by rotating the wafer at the third rotation number in the subsequent third step, a resist solution R is irregularly diffused outward in a shape of streaks at the outer peripheral portion of the wafer W as shown in FIG. 18, so that sharp coating mottles L radially appear in some cases. As described above, it was impossible to uniformly apply the resist solution within the wafer in the conventional method.

The present invention has been made in view of such points, and it is an object to, when applying a coating solution on a substrate, apply the coating solution uniformly within the substrate while suppressing the supply amount of the coating solution to a small amount.

To attain the above object, the present invention is a coating treatment method of applying a coating solution on a substrate, including: a first step of rotating the substrate at a first rotation number; a second step of subsequently decelerating the rotation of the substrate and rotating the substrate at a second rotation number lower than the first rotation number; a third step of subsequently further decelerating the rotation of the substrate and rotating the substrate at a third rotation number lower than the second rotation number; and a fourth step of subsequently accelerating the rotation of the substrate and rotating the substrate at a fourth rotation number higher than the third rotation number, wherein supply of the coating solution to a center portion of the substrate is continuously performed from the first step to a middle of the third step, and wherein the second rotation number is 1500 rpm to 2000 rpm.

Investigation by the inventors showed that when the coating solution is supplied to the substrate which is rotated at 1500 rpm to 2000 rpm that is the second rotation number, the coating solution can be diffused on the substrate while drying of the coating solution is suppressed. Accordingly, it was found that when the substrate is rotated at the second rotation number, the coating solution is diffused in a manner to be concentric with the substrate, so that the coating solution can be applied without causing a coating mottle on the substrate.

Besides, in the case where the supply amount of the coating solution to the substrate is set to be small, when trying to diffuse the coating solution on the substrate which is rotated at the second rotation number, the diffusing speed of the coating solution is low because the rotation speed of the substrate is low. Then, the film thickness distribution of the coating solution on the substrate will be non-uniform. This showed that to uniformly apply a small amount of coating solution on the substrate, the coating solution on the substrate needs to be diffused by rotating the substrate at the first rotation number higher than the second rotation number.

Hence, in the present invention, the coating solution is first supplied to the center portion of the substrate while the substrate is rotated at the first rotation number in the first step, so that the coating solution can be uniformly diffused even when the supply amount of the coating solution to the substrate is small. Thereafter, the substrate is rotated at the second rotation number in the second step, whereby the coating solution supplied in the first step is diffused on the substrate while drying of the coating solution is suppressed. This makes the coating solution supplied in the second step easily fit in the coating solution supplied in the first step, and the coating solution is thus diffused in a manner to be concentric with the substrate. Thereafter, the substrate is rotated at the third rotation number lower than the second rotation number in the third step, so that the coating solution on the substrate is evened out and flattened. In other words, by rotating the substrate at low speed at the third rotation number, for example, a force drawing toward the center portion acts on the coating solution at the outer peripheral portion of the substrate to uniform the film thickness of the coating solution. Further, since the coating solution is supplied to the center portion of the substrate in the third step, the fluidity of the coating solution on the substrate can be improved. Then, since the substrate is rotated at the fourth rotation number higher than the third rotation number in the fourth step, the coating solution can be smoothly diffused over the entire front surface of the substrate. In this event, the coating solution diffused in a manner to be concentric with the substrate in the second step is still diffused in a manner to be concentric with the substrate, thus causing no coating mottle on the substrate. As described above, according to the coating treatment method of the present invention, the coating solution can be applied uniformly within the substrate while the supply amount of the coating solution is suppressed to a small amount.

The present invention according to another aspect is a computer-readable storage medium storing a program running on a computer of a control unit controlling a coating treatment apparatus in order to cause the coating treatment apparatus to execute a coating treatment method, wherein the coating treatment method includes: a first step of rotating the substrate at a first rotation number; a second step of subsequently decelerating the rotation of the substrate and rotating the substrate at a second rotation number lower than the first rotation number; a third step of subsequently further decelerating the rotation of the substrate and rotating the substrate at a third rotation number lower than the second rotation number; and a fourth step of subsequently accelerating the rotation of the substrate and rotating the substrate at a fourth rotation number higher than the third rotation number, wherein supply of the coating solution to a center portion of the substrate is continuously performed from the first step to a middle of the third step, and wherein the second rotation number is 1500 rpm to 2000 rpm.

The present invention according to still another aspect is a coating treatment apparatus for applying a coating solution on a substrate, including: a rotating and holding unit holding and rotating the substrate; a coating solution nozzle supplying the coating solution to the substrate; and a control unit controlling the rotating and holding unit to execute a first step of rotating the substrate at a first rotation number; a second step of subsequently decelerating the rotation of the substrate and rotating the substrate at a second rotation number of 1500 rpm to 2000 rpm lower than the first rotation number; a third step of subsequently further decelerating the rotation of the substrate and rotating the substrate at a third rotation number lower than the second rotation number; and a fourth step of subsequently accelerating the rotation of the substrate and rotating the substrate at a fourth rotation number higher than the third rotation number, and controlling the coating solution nozzle to perform supply of the coating solution to a center portion of the substrate continuously from the first step to a middle of the third step.

According to the present invention, when applying a coating solution on a substrate, the coating solution can be applied uniformly within the substrate while the supply amount of the coating solution is suppressed to a small amount.

DETAILED DESCRIPTION OF THE INVENTION

Figure 1:
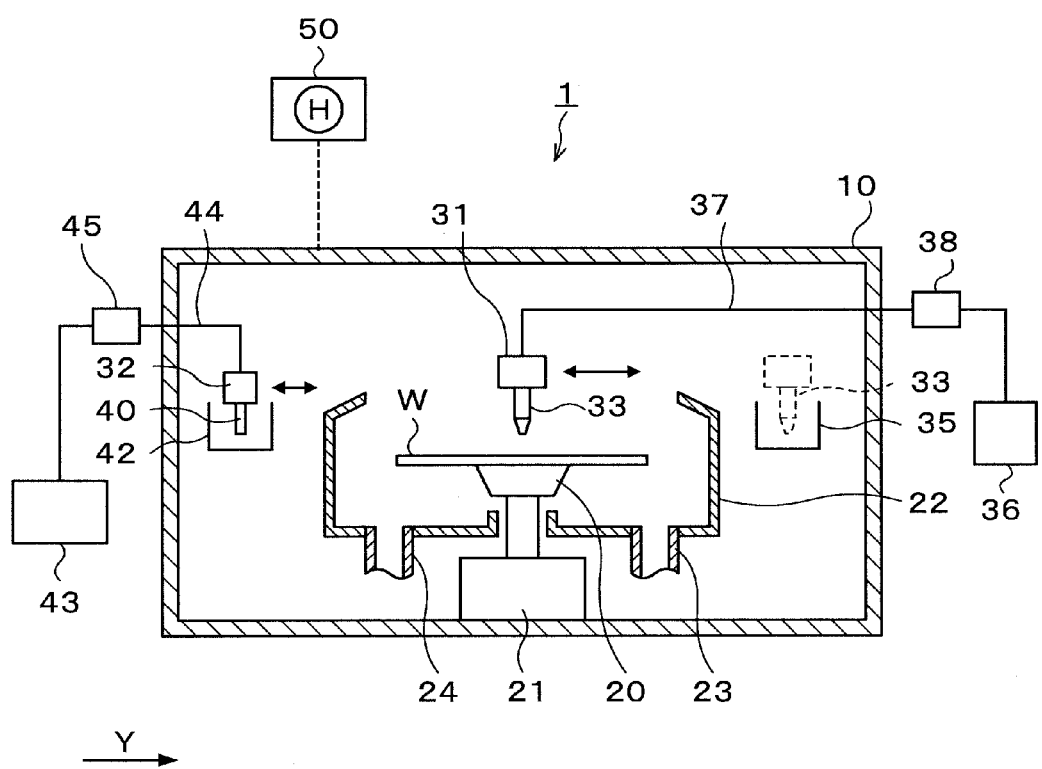
FIG. 1 is a longitudinal sectional view schematically showing the structure of a resist coating apparatus according to this embodiment.
Figure 2:
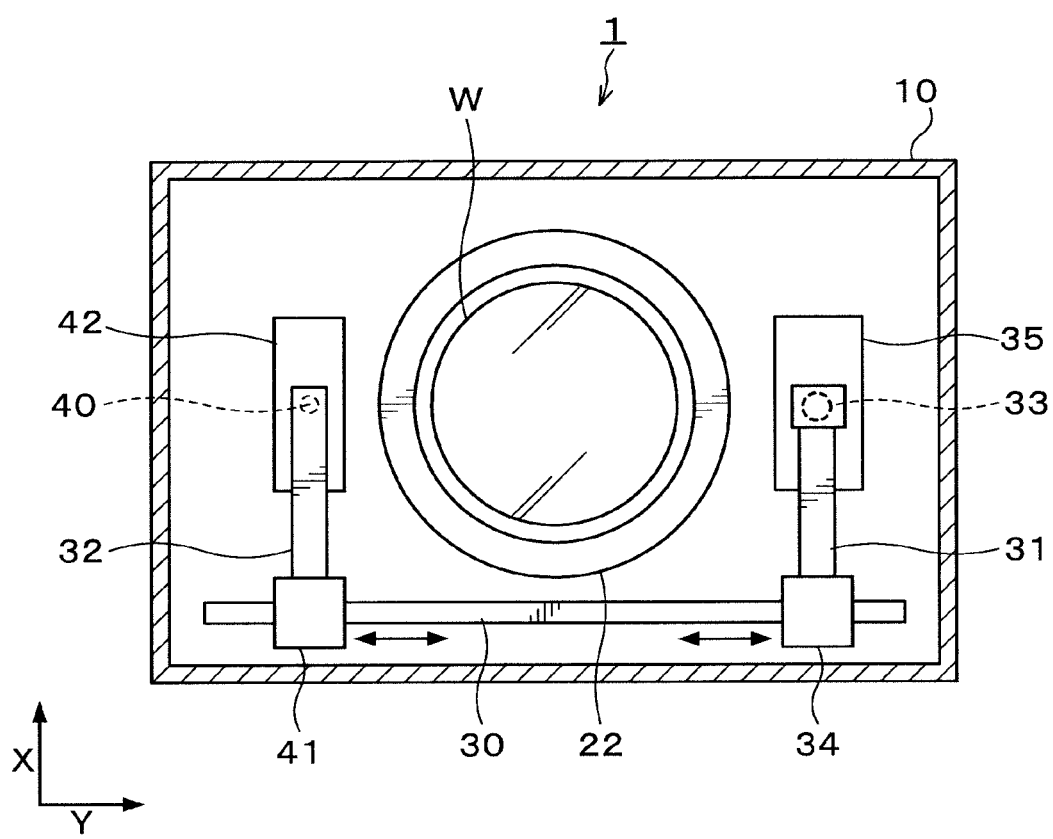
FIG. 2 is a transverse sectional view schematically showing the structure of the resist coating apparatus according to this embodiment.

Hereinafter, embodiments of the present invention will be described. FIG. 1 is a longitudinal sectional view schematically showing the structure of a resist coating apparatus 1 as a coating treatment apparatus according to this embodiment. FIG. 2 is a transverse sectional view schematically showing the structure of the resist coating apparatus 1. Note that a resist solution is used as a coating solution in this embodiment. Besides, the diameter of a wafer W used as a substrate is 300 mm in this embodiment.

As shown in FIG. 1, the resist coating apparatus 1 includes a treatment container 10 as shown in FIG. 1. At a center portion in the treatment container 10, a spin chuck 20 is provided as a rotating and holding unit for holding and rotating the wafer W. The spin chuck 20 has a horizontal upper surface and, this upper surface is provided with, for example, a suction port (not shown) through which the wafer W is sucked. Owing to the suction through the suction port, the wafer W can be suction-held on the spin chuck 20.

The spin chuck 20 has a chuck drive mechanism 21 including, for example, a motor and the like and can rotate at a predetermined speed by means of the chuck drive mechanism 21. The chuck drive mechanism 21 further has a lifting drive source such as a cylinder so that the spin chuck 20 is movable up and down.

Around the spin chuck 20, a cup 22 is provided which receives and collects liquid scattering or dropping from the wafer W. A drain pipe 23 for draining the collected liquid and an exhaust pipe 24 for exhausting the atmosphere in the cup 22 are connected to a lower surface of the cup 22.

As shown in FIG. 2, on an X-direction negative direction (downward direction in FIG. 2) side of the cup 22, a rail 30 extending in a Y-direction (right-left direction in FIG. 2) is formed. The rail 30 extends, for example, from a Y-direction negative direction (left direction in FIG. 2) side outer position of the cup 22 to a Y-direction positive direction (right direction in FIG. 2) side outer position of the cup 22. For example, two arms 31, 32 are attached to the rail 30.

On the first arm 31, a resist solution nozzle 33 as a coating solution nozzle is supported which supplies the resist solution to the wafer W as shown in FIG. 1 and FIG. 2. The first arm 31 is movable on the rail 30 by means of a nozzle drive unit 34 shown in FIG. 2. Therefore, the resist solution nozzle 33 can move from a waiting section 35 provided at the Y-direction positive direction side outer position of the cup 22 to a position above the center portion of the wafer W in the cup 22, and can further move above the front surface of the wafer W in a diameter direction of the wafer W. Further, the first arm 31 is movable up and down by the nozzle drive unit 34 and thus can adjust the height of the resist solution nozzle 33.

A supply pipe 37 communicating with a resist solution supply source 36 is connected to the resist solution nozzle 33 as shown in FIG. 1. In the resist solution supply source 36, a resist solution is stored. A supply equipment group 38 including a valve, a flow adjusting unit and so on controlling the flow of the resist solution is provided along the supply pipe 37.

On the second arm 32, a solvent nozzle 40 is supported which supplies a solvent for the resist solution, for example, a thinner. The second arm 32 is movable on the rail 30 by means of a nozzle drive unit 41 shown in FIG. 2 and can move the solvent nozzle 40 from a waiting section 42 provided at a Y-direction negative direction side outer position of the cup 22 to the position above the center portion of the wafer W in the cup 22. Further, the second arm 32 is movable up and down by means of the nozzle drive unit 41 and thus can adjust the height of the solvent nozzle 40.

A supply pipe 44 communicating with a solvent supply source 43 is connected to the solvent nozzle 40 as shown in FIG. 1. In the solvent supply source 43, a solvent is stored. A supply equipment group 45 including a valve, a flow adjusting unit and so on controlling the flow of the solvent is provided along the supply pipe 44. Note that in the above-described structure, the resist solution nozzle 33 supplying the resist solution and the solvent nozzle 40 supplying the solvent are supported on the separate arms, but they may be supported on the same arm, and the movements and the supply timings of the resist solution nozzle 33 and the solvent nozzle 40 may be controlled through the control over the movement of the arm.

The operations of the drive system such as the rotation operation and the up/down moving operation of the spin chuck 20, the moving operation of the resist solution nozzle 33 by the nozzle drive unit 34, the supply operation of the resist solution of the resist solution nozzle 33 by the supply equipment group 38, the moving operation of the solvent nozzle 40 by the nozzle drive unit 41, and the supply operation of the solvent of the solvent nozzle 40 by the supply equipment group 45 which are described above are controlled by a control unit 50. The control unit 50 is composed of, for example, a computer including a CPU, a memory and so on, and executes programs stored in, for example, the memory to be able to realize the resist coating treatment in the resist coating apparatus 1. Note that as the various programs used for realizing the resist coating treatment in the resist coating apparatus 1 are those stored in, for example, a computer-readable storage medium H such as a hard disk (HD), a flexible disk (FD), a compact disk (CD), a magneto-optical disk (MO), a memory card, and installed from the storage medium H to the control unit 50.

Figure 3:
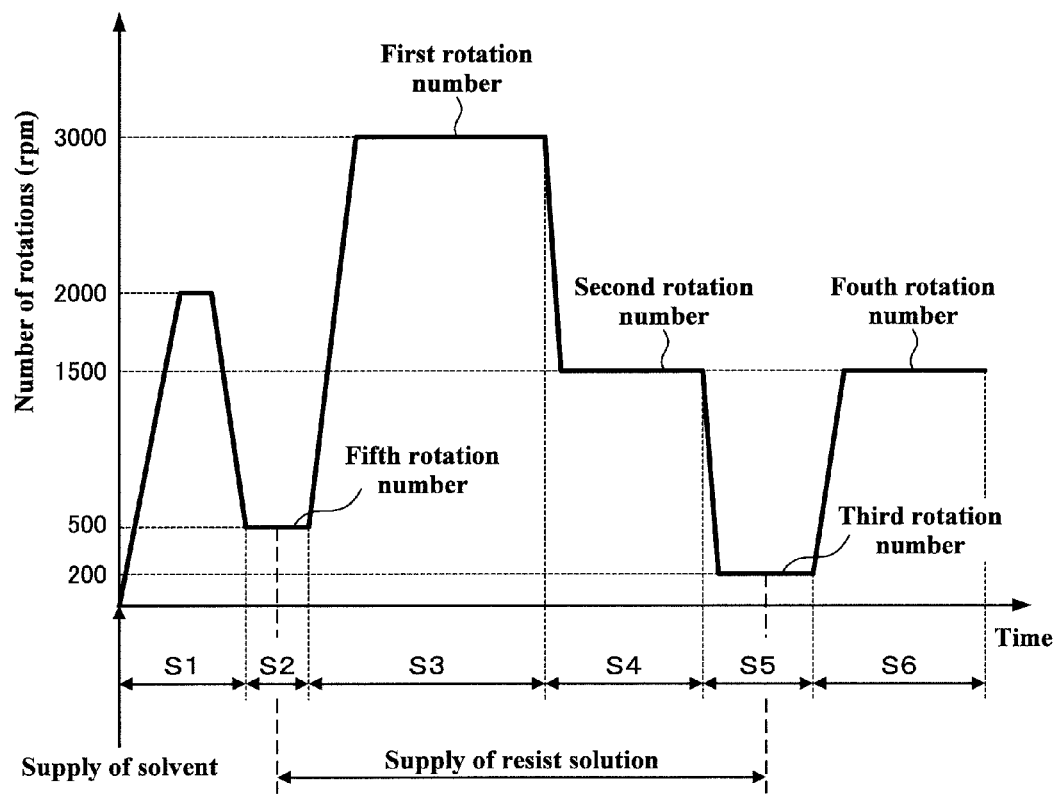
FIG. 3 is a graph showing the number of rotations of a wafer and supply timings of a resist solution and a solvent in each of steps of a coating treatment process.

Next, the coating treatment process performed in the resist coating apparatus 1 structured as described above will be described. FIG. 3 is a graph showing the number of rotations of the wafer W and supply timings of the resist solution and the solvent in each of the steps of the coating treatment process. FIGS. 4A to 4E schematically show the appearances of a solution film on the wafer W in main steps of the coating treatment process. Note that the length of time of the process in FIG. 3 does not always correspond to the actual time for easy understanding of the technique.

The wafer W after carried to the resist coating apparatus 1 is first suction-held on the spin chuck 20. Subsequently, the solvent nozzle 40 at the waiting section 42 is moved by the second arm 32 to the position above the center portion of the wafer W. Next, as shown in FIG. 3, while the wafer W is kept stopped, a predetermined amount of the solvent is supplied from the solvent nozzle 40 to the center portion of the wafer W. Thereafter, the wafer W is rotated by the spin chuck 20 by controlling the chuck drive mechanism 21, and the number of rotations is increased, for example, up to 2000 rpm. By rotating the wafer W at the number of rotations of 2000 rpm, for example, for 0.3 seconds, the solvent supplied on the center portion of the wafer W is diffused to the outer peripheral portion, namely, pre-wetting is performed so that the front surface of the wafer W is wetted with the solvent. Thereafter, when the solvent is diffused on the entire front surface of the wafer W, the rotation of the wafer W is decelerated, for example, to 10 rpm to 500 rpm that is a fifth rotation number, 500 rpm in this embodiment (Step S1 in FIG. 3). While the solvent is being diffused on the wafer W, the solvent nozzle 40 is moved from the position above the center portion of the wafer W and the resist solution nozzle 33 at the waiting section 35 is moved to the position above the center portion of the wafer W by the first arm 31.

Figure 4A:
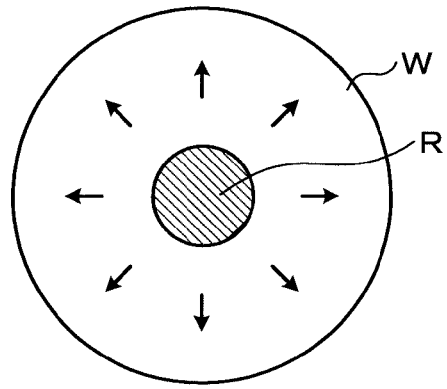
FIG. 4A is an explanatory view showing the appearance of the resist solution diffusing on the wafer rotated at a fifth rotation number.

Thereafter, the wafer W is rotated at the fifth rotations number, for example, for 0.4 seconds. In this event, a predetermined amount of the resist solution is supplied from the resist solution nozzle 33 to the center portion of the wafer W after, for example, 0.2 seconds from the start of rotation of the wafer W at the fifth rotation number (Step S2 in FIG. 3). A resist solution R supplied as shown in FIG. 4A is diffused on the wafer W by the rotation of the wafer W. Note that the supply of the resist solution R in this Step S2 is continuously performed to the middle of Step S5 as described later.

Figure 4B:
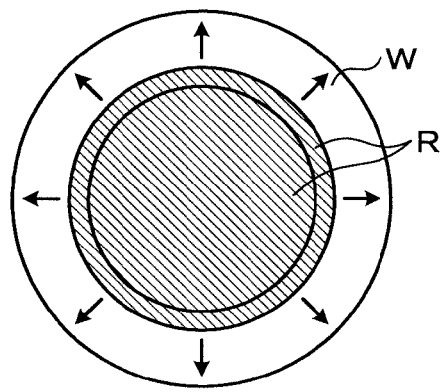
FIG. 4B is an explanatory view showing the appearance of the resist solution diffusing on the wafer rotated at a first rotation number.

Thereafter, as shown in FIG. 3, the rotation of the wafer W is accelerated to, for example, 2000 rpm to 3500 rpm that is a first rotation number, 3000 rpm in this embodiment, and the wafer W is then rotated at the first rotation number, for example, for 0.8 seconds. During the accelerating rotation and the rotation at the first rotation number of the wafer W, the resist solution R is continuously supplied from the resist solution nozzle 33 (Step S3 in FIG. 3). The supplied resist solution R is diffused on the wafer W by the rotation of the wafer W as shown in FIG. 4B. In this Step S3, the supply amount of the resist solution R is small so that the resist solution R is not diffused to the end of the wafer W yet. Besides, the wafer W is rotated at high speed at the first rotation number, but the rotation of the wafer W at the first rotation number continues for a short time of 0.8 seconds so that the resist solution R on the wafer W is not completely dried yet.

Figure 4C:
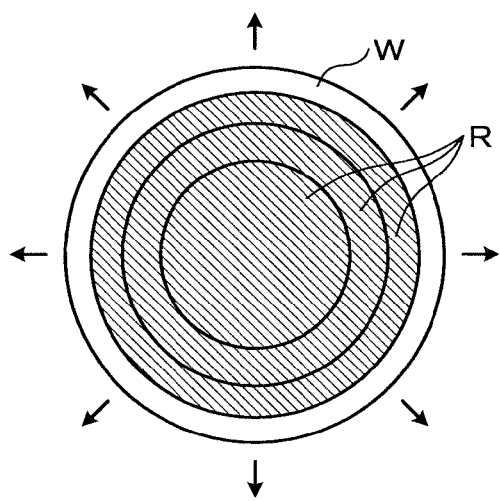
FIG. 4C is an explanatory view showing the appearance of the resist solution diffusing on the wafer rotated at a second rotation number.

Thereafter, as shown in FIG. 3, the rotation of the wafer W is decelerated to, for example, 1500 rpm to 2000 rpm that is a second rotation number, 1500 rpm in this embodiment, and the wafer W is then rotated at the second rotation number. The rotation of the wafer W at the second rotation number is performed for 0.4 seconds or longer, 0.5 seconds in this embodiment. During the decelerating rotation and the rotation at the second rotation number of the wafer W, the resist solution R is continuously supplied from the resist solution nozzle 33 (Step S4 in FIG. 3). The supplied resist solution R is diffused on the wafer W by the rotation of the wafer W as shown in FIG. 4C. In this Step S4, the number of rotations of the wafer W is decreased to the second rotation number, so that the drying of the resist solution R on the wafer W can be suppressed. This makes the resist solution R supplied in Step S4 easily fit in the resist solution R previously supplied in Step S3, and the resist solution R is thus diffused in a manner to be concentric with the wafer W. During the Step S4, the resist solution R is diffused down to the outer peripheral portion of the wafer W but not to the end of the wafer W yet. The examination by the inventors showed that the rotation of the wafer W performed at the second rotation number for 0.4 seconds or longer can sufficiently suppress drying of the resist solution R on the wafer W.

Thereafter, as shown in FIG. 3, the rotation of the wafer W is further decelerated to, for example, 100 rpm to 800 rpm that is a third rotation number, 200 rpm in this embodiment, and the wafer W is then rotated at the third rotation number, for example, for 0.4 seconds. During the decelerating rotation and until the middle of the rotation at the third rotation number of the wafer W, the resist solution R is continuously supplied from the resist solution nozzle 33. In other words, the supply of the resist solution R continuously performed from Step S2 is stopped after, for example, 0.2 seconds from the start of the rotation of the wafer W at the third rotation number (Step S5 in FIG. 3). During this Step S5, the wafer W is rotated at low speed at the third rotation number, so that a force drawing toward the center portion acts on the resist solution R at the outer peripheral portion of the wafer W to even out and flatten the resist solution R on the wafer W.

Figure 4D:
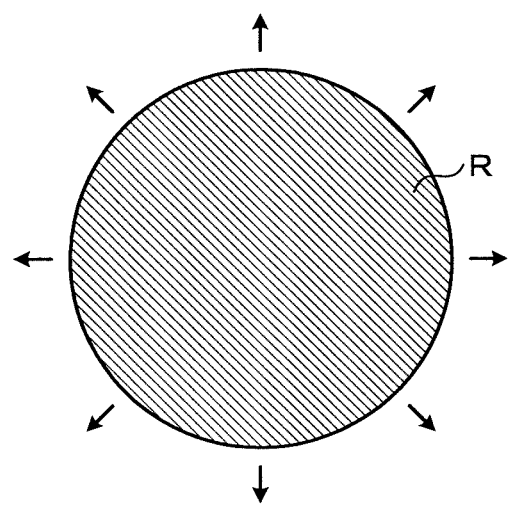
FIG. 4D is an explanatory view showing the appearance of the resist solution diffusing on the wafer rotated at a fourth rotation number.
Figure 4E:
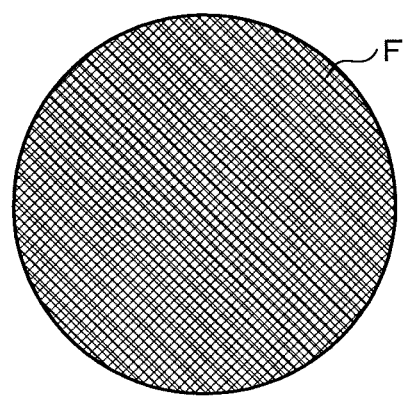
FIG. 4E is an explanatory view showing the appearance of the resist solution formed on the wafer.

Thereafter, the rotation of the wafer W is accelerated to, for example, 1000 rpm to 1800 rpm that is a fourth rotation number, 1500 rpm in this embodiment, and the wafer W is then rotated at the fourth rotation number, for example, for 2.5 seconds (Step S6 in FIG. 3). During this Step S6, as shown in FIG. 4D, the resist solution R is diffused over the entire front surface of the wafer W, and the residual resist solution R is spun off so that the film thickness of the resist solution R is adjusted. Then, as shown in FIG. 4E, the resist solution R diffused over the entire front surface of the wafer W is dried, so that a resist film F is formed on the wafer W.

Thereafter, the rear surface of the wafer W is cleaned, whereby a series of coating treatment in the resist coating apparatus 1 is finished.

Now it is verified that when the number of rotations of the wafer W is set to 1500 rpm to 2000 rpm that is the second rotation number in the above-described Step S4, the resist solution R on the wafer W rotated at the second rotation number is diffused on the wafer W while drying of the resist solution R is suppressed.

The inventors performed this verification by supplying eight kinds of resist solutions R1 to R8 different in material onto the wafer W while rotating the wafer W having a diameter of 300 mm at various rotation numbers. These resist solutions R1 to R8 are different, for example, in kind of the additive contained in the resist solution. When the drying of the resist solution R on the wafer W is suppressed here, the resist solution R is concentrically diffused on the wafer W, so that the resist solution R can be applied without causing a coating mottle on the wafer W. Therefore, in this verification, whether or not coating mottles of the resist solutions R1 to R8 occur on the wafer W were verified.

Figure 5:
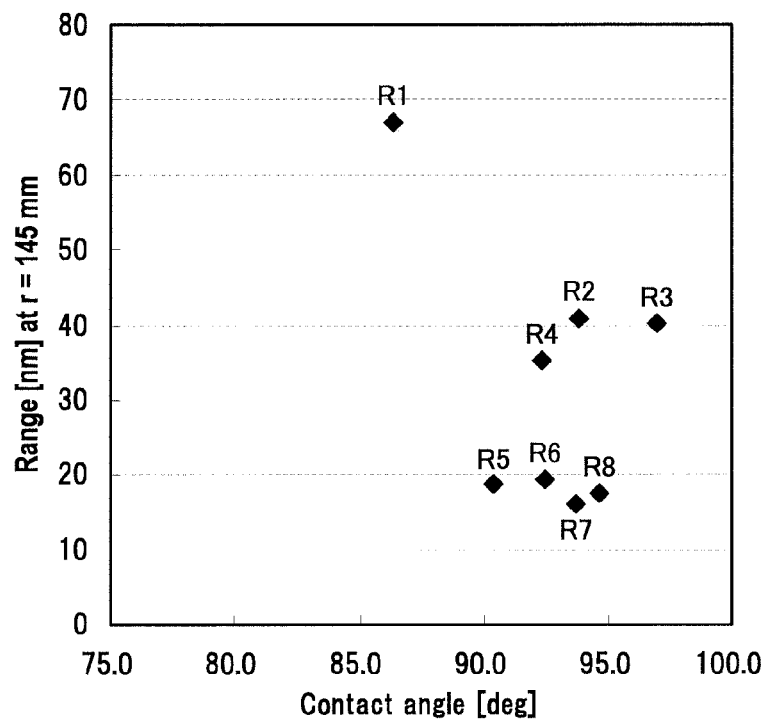
FIG. 5 is a graph showing the relation between the range of the film thickness of the resist solution at positions located at 145 mm from the center of the wafer and the contact angle of the resist solution.

First, the case when the wafer W is rotated at the number of rotations of 3000 rpm that is the first rotation number will be described as a comparative example. In this event, each supply amount of the resist solutions R1 to R8 to the wafer W was 0.4 ml. Further, the supply of each of the resist solutions R1 to R8 to the wafer W was performed for 1.7 seconds. The result of the supply is shown in FIG. 5. The vertical axis in FIG. 5 indicates the range of the film thickness of each of the resist solutions R1 to R8 at positions located at 145 mm from the center of the wafer W, that is, the difference between the maximum value and the minimum value of the film thickness of each of the resist solutions R1 to R8. The horizontal axis in FIG. 5 indicates the contact angle of each of the resist solutions R1 to R8 on the wafer W. Referring to FIG. 5, the ranges of the film thicknesses of all of the resist solutions R1 to R8 were not zero, but coating mottles of the resist solutions R1 to R8 occurred on the wafer W. In short, it was found that the coating mottle occurs on the wafer W only by rotating the wafer W only at the first rotation number. Note that in this case, the contact angles of all of the resist solutions R1 to R8 on the wafer W were 85 degrees or larger.

Figure 6:
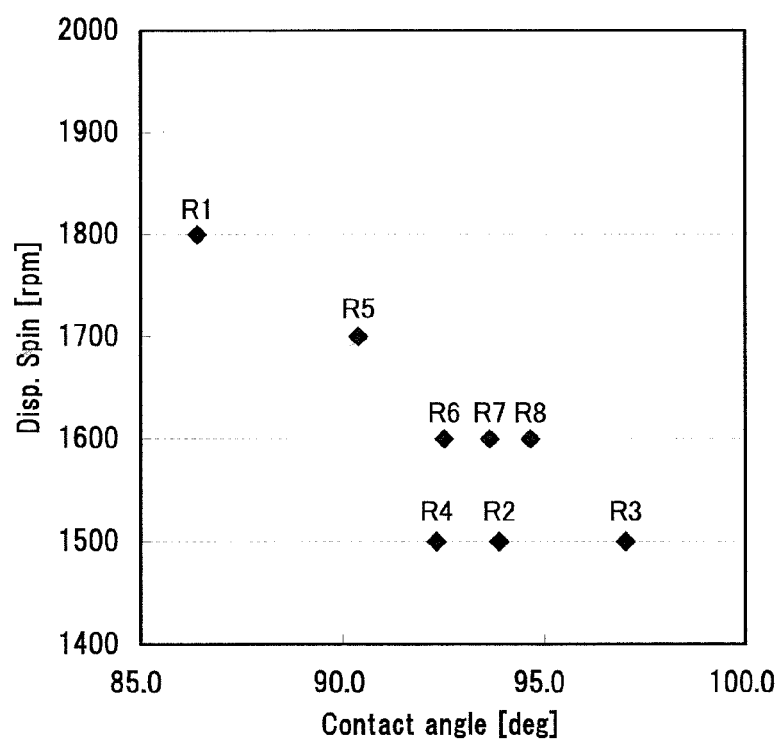
FIG. 6 is a graph showing the relation between the number of rotations of the wafer causing no coating mottle and the contact angle of the resist solution.

Hence, the inventors examined the number of rotations of the wafer W at which the resist solutions R1 to R8 could be applied in a manner not to cause the coating mottle on the wafer W. The result is shown in FIG. 6. The vertical axis in FIG. 6 indicates the number of rotations of the wafer W causing no coating mottle. The horizontal axis in FIG. 6 indicates the contact angle of each of the resist solutions R1 to R8 on the wafer W. Referring to FIG. 6, it was found that no coating mottle occurs on the wafer W in all of the resist solutions R1 to R8 at the number of rotations of the wafer W ranging from 1500 rpm to 2000 rpm even if the contact angles of the resist solutions R1 to R8 are 85 degrees or larger. Accordingly, it was found that when the second rotation number of the wafer W is set to 1500 rpm to 2000 rpm as in this embodiment, the resist solution R can be diffused on the wafer W while drying of the resist solution R is suppressed.

According to the above embodiment, first, the resist solution R is supplied to the center portion of the wafer W while the wafer W is rotated at the first rotation number in Step S3, whereby the resist solution R can be uniformly diffused even if the supply amount of the resist solution R to the wafer W is small. Thereafter, the wafer W is rotated at the second rotation number in Step S4, whereby the resist solution R supplied in Step S3 is diffused on the wafer W while drying of the resist solution R is suppressed even when the contact angle of the resist solution R is 85 degrees or larger. This makes the resist solution R supplied in Step S4 easily fit in the resist solution R supplied in Step S3, so that the resist solution R is concentrically diffused on the wafer W. As a result, also when the resist solution R is thereafter diffused over the entire front surface of the wafer W in Step S6, the resist solution R is concentrically diffused on the wafer W. Therefore, the coating mottle of the resist solution R never occurs on the wafer W. Accordingly, it is possible to apply the resist solution R uniformly within the wafer while suppressing the supply amount of the resist solution R to the wafer W to a small amount.

The examination by the inventors showed that the supply amount of the resist solution R required for applying the resist solution R without a coating mottle on the wafer W when using the coating treatment method of this embodiment was 0.4 ml. In contrast, the supply amount of the required resist solution when using the above-described conventional coating treatment method was 0.9 ml. Therefore, it was found that the supply amount of the resist solution R can be drastically reduced according to this embodiment.

The inventors further verified the effect capable of applying the resist solution R uniformly on the wafer W without a coating mottle when using the coating treatment method of this embodiment. In the verification, the resist solution R was applied on the wafer W using the conventional coating treatment method as a comparative example. More specifically, in the comparative example, the rotation of the wafer W was decelerated from the first rotation number to the third rotation number without passing through the second rotation number, unlike this embodiment. The remaining recipe of the comparative example is the same as that of the coating recipe of this embodiment. Note that in this verification, the verification was performed setting the second rotation number to 1800 rpm in the range of 1500 rpm to 2000 rpm.

Figure 7:
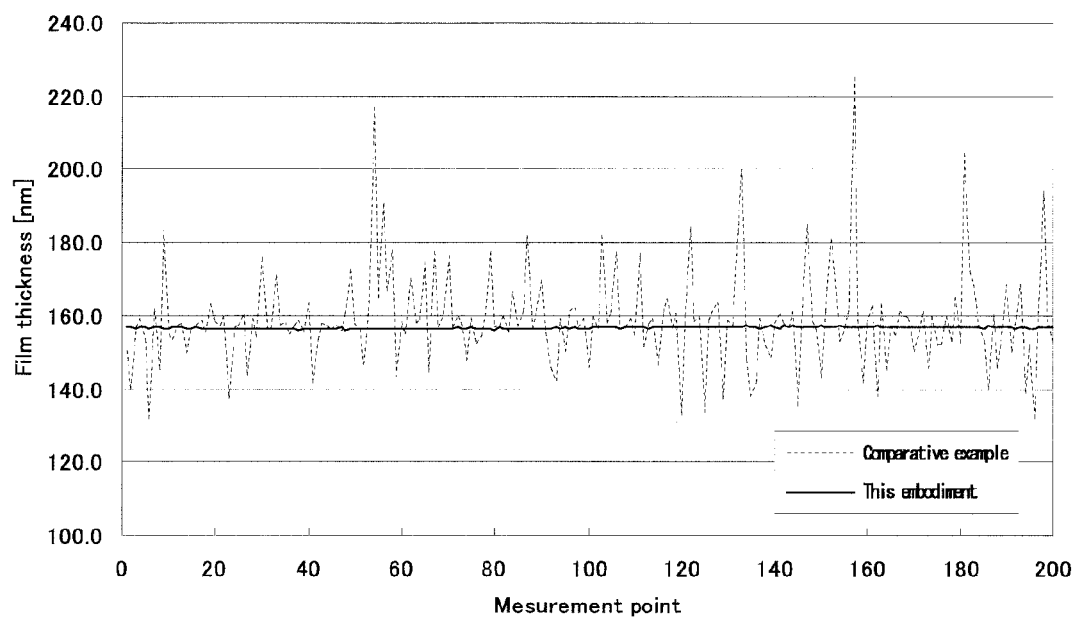
FIG. 7 is a graph showing the film thickness of the resist film on the outer peripheral portion of the wafer in this embodiment and a comparative example.

The result of the verification is shown in FIG. 7. The horizontal axis in FIG. 7 indicates the measurement point of the film thickness of the resist film. Specifically, a plurality of points on the outer peripheral portion of the wafer W were taken as the measurement points. The vertical axis in FIG. 7 indicates the film thickness of the resist film at each of the measurement points. Referring to FIG. 7, it was found that the film thickness of the resist film is non-uniform in the comparative example, whereas the film thickness of the resist film is uniform in this embodiment. Accordingly, it was found that the resist solution R can be applied uniformly within the wafer without causing a coating mottle in this embodiment, unlike the prior art.

Further, in Step S5, since the wafer W is rotated at the third rotation number lower than the second rotation number, the force drawing toward the center portion acts on the resist solution R at the outer peripheral portion of the wafer W to even out the film thickness of the resist solution R. Further, since the undried resist solution R is supplied onto the wafer W in Step 5, the fluidity of the resist solution R on the wafer W can be improved. This allows the resist solution R to smoothly diffuse to the end of the wafer W in subsequent Step S6.

Further, in Step S2, since the resist solution R is supplied onto the wafer W rotated at low speed at the fifth rotation number, the resist solution R can be smoothly and unforcedly diffused. This makes it possible to prevent more surely occurrence of a coating mottle of the resist solution R.

Further, in Step S1, since the pre-wetting is performed on the wafer W with the solvent for the resist solution R, the resist solution R supplied on the wafer W in the subsequent step can be smoothly diffused.

Figure 8:
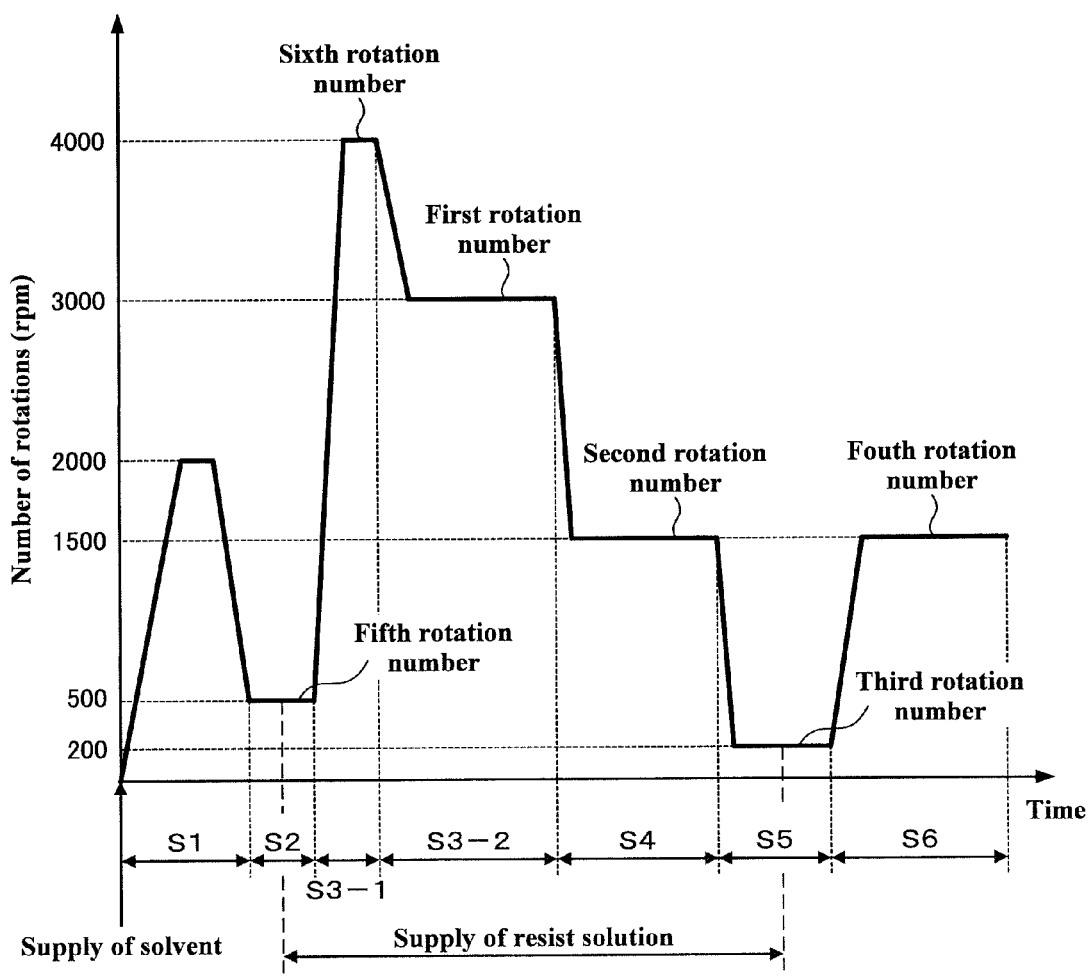
FIG. 8 is a graph showing the number of rotations of the wafer and supply timings of the resist solution and the solvent in each of the steps of the coating treatment process according to another embodiment.

In the above-described Step S3 of this embodiment, the wafer W may be rotated at a sixth rotation number higher than the first rotation number before the wafer W is rotated at the first rotation number as shown in FIG. 8.

For example, after Step S2, the rotation of the wafer W is accelerated to the sixth rotation number, for example, 4000 rpm or lower that is the sixth rotation number, 4000 rpm in this embodiment, and the wafer W is then rotated at the sixth rotation number. The rotation of the wafer W at the sixth rotation number is performed for 0.1 seconds to 0.5 seconds, 0.2 seconds in this embodiment (Step S3-1 in FIG. 8). Thereafter, the rotation of the wafer W is decelerated to the first rotation number, and the wafer W is then rotated at the first rotation number, for example, for 0.6 seconds (Step S3-2 in FIG. 8). Note that the resist solution R is continuously supplied from the resist solution nozzle 33 to the center portion of the wafer W also in Step S3-1 and Step S3-2. Description of other Steps S1, S2, S4, S5 and S6 will be omitted because they are the same as those in the above-described embodiment.

In this case, since the resist solution R is supplied onto the wafer W while the wafer W is rotated at the sixth rotation number in Step S3-1, the resist solution R can be more smoothly and uniformly diffused. Accordingly, the supply amount of the resist solution R onto the wafer W can be made smaller. Besides, the case in which the time required for Step S3-1 and Step S3-2 is substantially the same as the time required for Step S3 in the above-described embodiment has been described in this embodiment. The resist solution R can be smoothly diffused as described above, and therefore it is also possible to reduce the time required for Step S3-1 and Step S3-2. The examination by the inventors showed that the rotation of the wafer W at the sixth rotation number performed for 0.1 seconds to 0.5 seconds can sufficiently achieve the effect capable of making the above-described supply amount of the resist solution R to small. Therefore, the rotation of the wafer W at the sixth rotation number can be reduced to 0.2 seconds or shorter.

Figure 9:
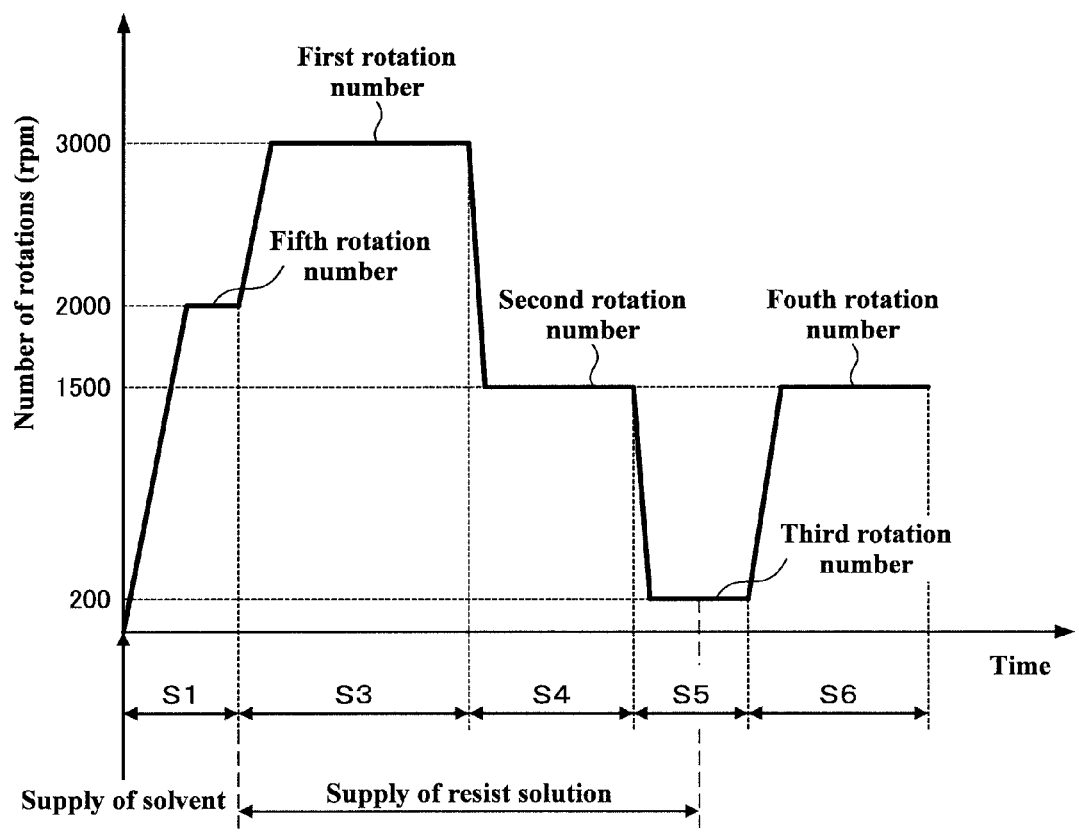
FIG. 9 is a graph showing the number of rotations of the wafer and supply timings of the resist solution and the solvent in each of the steps of the coating treatment process according to another embodiment.

The solvent is applied to the front surface of the wafer W while the wafer W is rotated at the number of rotations of, for example, 2000 rpm in Step S1 and the rotation of the wafer W is then decelerated to the fifth rotation number in the above-described embodiment. However, Step S3 may be started without decelerating the rotation of the wafer W, namely, without passing through the above-described Step S2 as shown in FIG. 9. In this case, Step S3 is started in a state where the rotation of the wafer W is kept, for example, at 2000 rpm. In other words, 2000 rpm is the fifth rotation number in this embodiment. Thereafter, in Step S3, the rotation of the wafer W is accelerated up to the first rotation number and the wafer W is then rotated at the first rotation number. Further, concurrently with the start of Step S3, the supply of the resist solution R from the resist solution nozzle 33 is started and continued to the middle of Step S5. Note that description of other Steps S4, S5 and S6 will be omitted because they are the same as those in the above-described embodiment.

In this case, since Step S3 is started without decelerating the rotation of the wafer W after the solvent is applied on the front surface of the wafer W in Step S1, the rotation of the wafer W in Step S3 is maintained at a relatively high speed as compared to the above-described embodiment. Therefore, a relatively strong centrifugal force acts on the resist solution R on the wafer W, so that the film thickness uniformity of the resist solution R within the wafer can be further improved.

Figure 10:
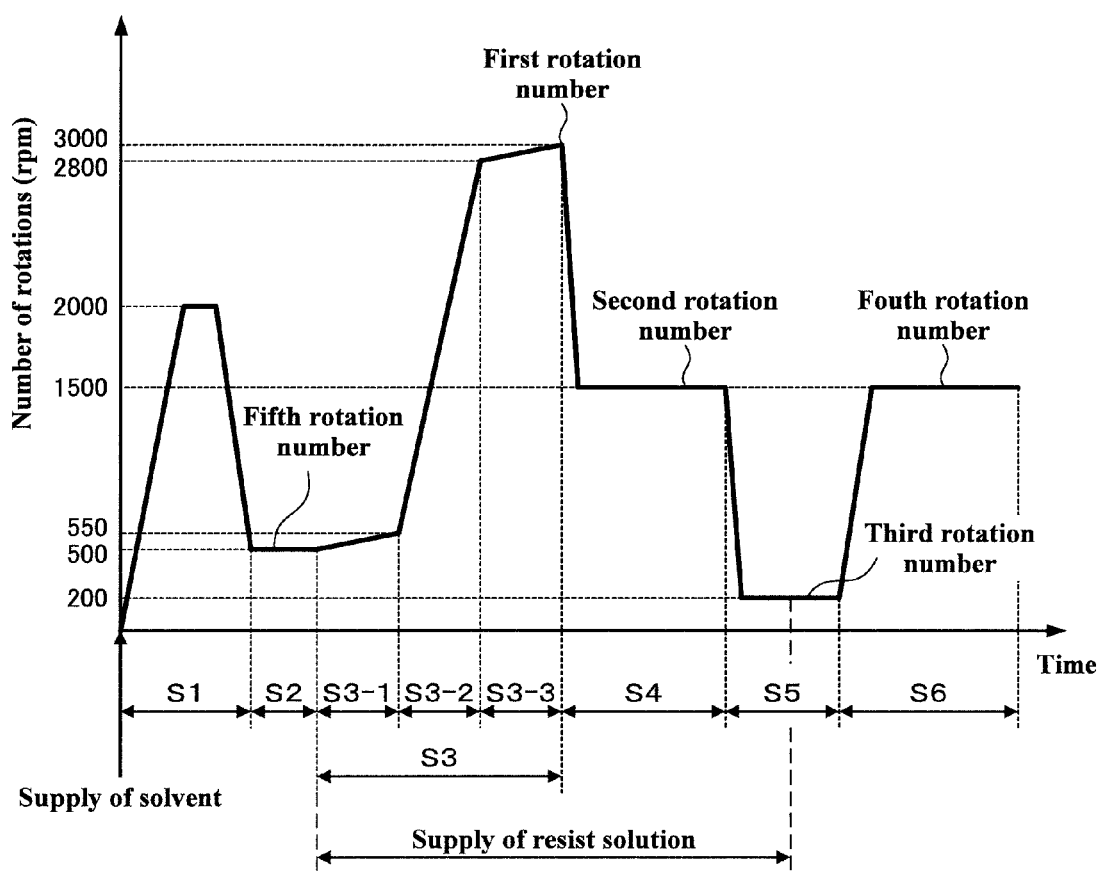
FIG. 10 is a graph showing the number of rotations of the wafer and supply timings of the resist solution and the solvent in each of the steps of the coating treatment process according to another embodiment.

In Step S3 of the above-described embodiment, the wafer W may be acceleratingly rotated at all times as shown in FIG. 10. In Step S3, the rotation of the wafer W is accelerated from the fifth rotation number, for example, to 550 rpm (Step S3-1 in FIG. 10). In this Step S3-1, the acceleration of the rotation of the wafer W is the first acceleration, for example, 500 rpm/s or lower, more preferably, 100 rpm/s. Immediately after the resist solution R is discharged to the center portion of the wafer W, the rotation speed of the wafer W is low, so that the strong centrifugal force does not act on the resist solution R on the wafer W. In addition, the first acceleration of the rotation of the wafer W is also low, so that the centrifugal force acting on the resist solution R on the wafer W is suppressed. Therefore, the resist solution R is uniformly diffused outward.

Subsequently, the rotation of the wafer W is accelerated from 550 rpm to, for example, 2800 rpm (Step S3-2 in FIG. 10). In this Step S3-2, the acceleration of the rotation of the wafer is the second acceleration, for example, 5000 rpm/s to 3000 rpm/s higher than the first acceleration, more preferably, 10000 rpm/s. Since the wafer W is acceleratingly rotated at the second acceleration higher than the first acceleration as described above, the resist solution R on the wafer W is smoothly and quickly diffused.

Subsequently, the rotation of the wafer W is accelerated from 2800 rpm to the first rotation number (Step S3-3 in FIG. 10). In this Step S3-3, the acceleration of the rotation of the wafer W is the third acceleration, for example, 500 rpm/s or lower, lower than the second acceleration, more specifically, 100 rpm/s. Since the wafer W is acceleratingly rotated at the third acceleration lower than the second acceleration as described above, the resist solution R reached to the outer peripheral portion of the wafer W can be smoothly diffused while the amount of the resist solution R scattering to the outside of the wafer W can be suppressed to a very small amount.

In Step S3, the acceleration of the rotation of the wafer W is varied in an order of the first acceleration, the second acceleration and the third acceleration in which the wafer W is acceleratingly rotated at all times as described above. Further, in Step S3, the resist solution R is continuously supplied to the center portion of the wafer W. Then, the supplied resist solution R is diffused over the entire front surface of the wafer W by the centrifugal force, whereby the resist solution R is applied on the front surface of the wafer W. Note that description of other Steps S1, S2, S4, S5 and S6 will be omitted because they are the same as those in the above-described embodiment.

In this case, in Step S3, since the wafer W is acceleratingly rotated at all times, the resist solution R can be quickly diffused and the supply amount for diffusing the resist solution R over the entire front surface of the wafer W can be suppressed to small. Further, immediately after the resist solution R is discharged to the center portion of the wafer W in Step S3-1, the strong centrifugal force does not act on the resist solution R on the wafer W because the rotation speed of the wafer W is low. In addition, the acceleration of the rotation of the wafer W in this event is the first acceleration lower than the second acceleration, so that the centrifugal force acting on the resist solution R on the wafer W is suppressed. Therefore, the resist solution R is uniformly diffused outward without causing a coating mottle appearing on the wafer W, unlike the prior art. Since the wafer W is acceleratingly rotated at the second acceleration higher than the first acceleration in subsequent Step S3-2, the resist solution R on the wafer W is smoothly and quickly diffused. Since the wafer W is then acceleratingly rotated at the third acceleration lower than the second acceleration in Step S3-3, the resist solution R reached to the outer peripheral portion of the wafer W can be smoothly diffused while the amount of the resist solution R scattering to the outside of the wafer W can be suppressed to a very small amount. Therefore, according to this embodiment, even when the supply amount of the resist solution R is small, the resist solution R can be more uniformly applied within the wafer.

Figure 11:
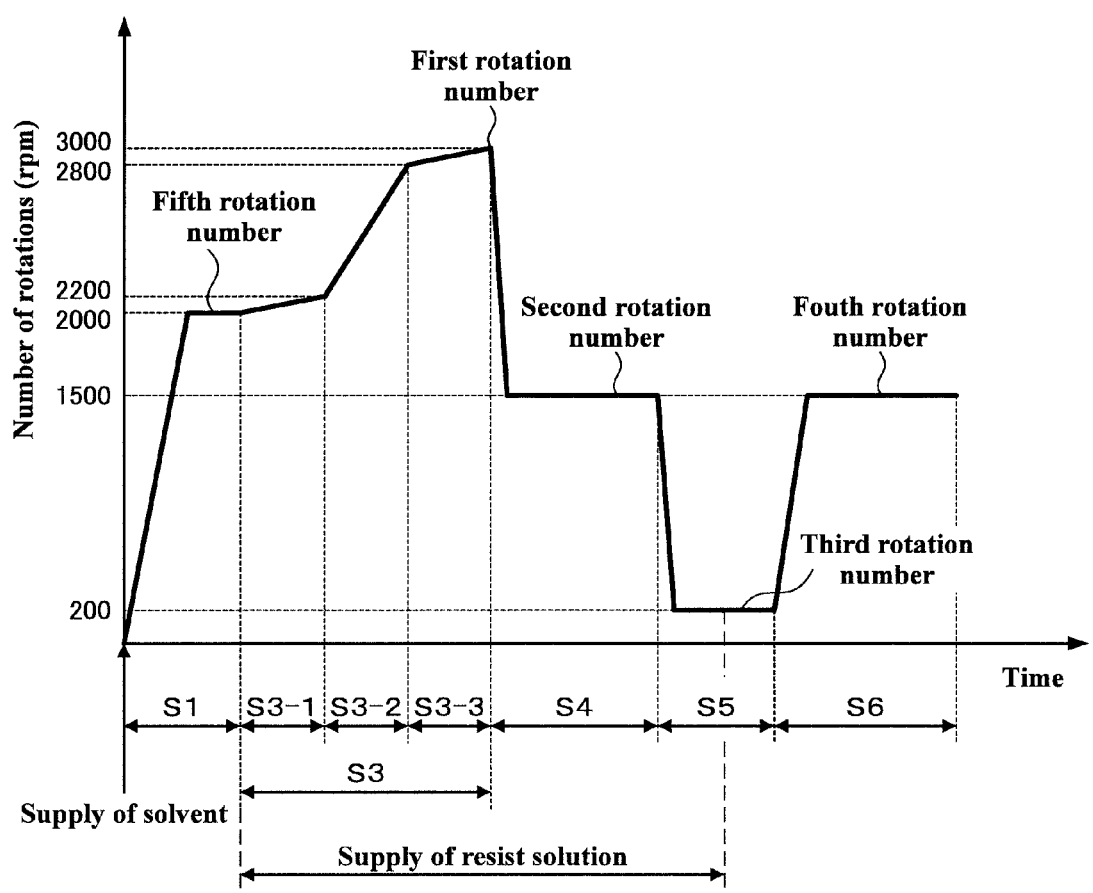
FIG. 11 is a graph showing the number of rotations of the wafer and supply timings of the resist solution and the solvent in each of the steps of the coating treatment process according to another embodiment.

Note that, also in this embodiment, Step S3 may be started without decelerating the rotation of the wafer W to the fifth rotation number in Step S1 as shown in FIG. 9. More specifically, the rotation of the wafer W is accelerated from 2000 rpm to, for example, 2200 rpm in Step S3-1, subsequently the rotation of the wafer W is accelerated from 2200 rpm to, for example, 2800 rpm in Step S3-2, and subsequently the rotation of the wafer W is accelerated from 2800 rpm to the first rotation number in Step S3-3 as shown in FIG. 11. Also in this case, the resist solution R can be diffused uniformly within the wafer while the supply amount of the resist solution R is suppressed to a small amount.

Figure 12:
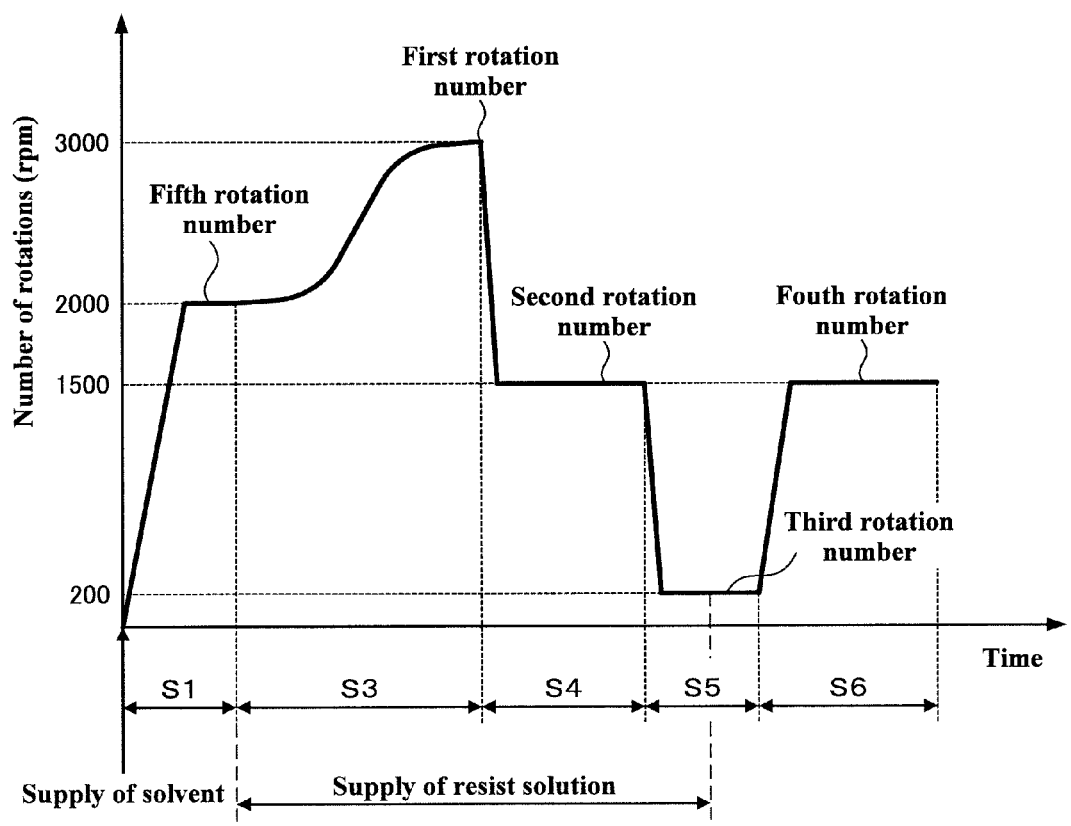
FIG. 12 is a graph showing the number of rotations of the wafer and supply timings of the resist solution and the solvent in each of the steps of the coating treatment process according to another embodiment.

Though the wafer W is acceleratingly rotated at all times in Step S3 in the above embodiments, the method of acceleratingly rotating the wafer W is not limited to the methods shown in FIG. 10 and FIG. 11. For example, as shown in FIG. 12, the wafer W may be acceleratingly rotated such that the number of rotations of the wafer W is varied in an S-shape from the fifth rotation number to the first rotation number in Step S3. In other words, the rotation of the wafer W at the fifth rotation number before start of Step S3 is gradually accelerated such that the number of rotations thereafter is continuously and smoothly varied. In this event, the acceleration of the rotation of the wafer W is gradually increased, for example, from zero. Then, at the end of Step S3, the acceleration of the rotation of the wafer W is gradually decreased and the number of rotations of the wafer W smoothly converges to the first rotation number.

Figure 13:
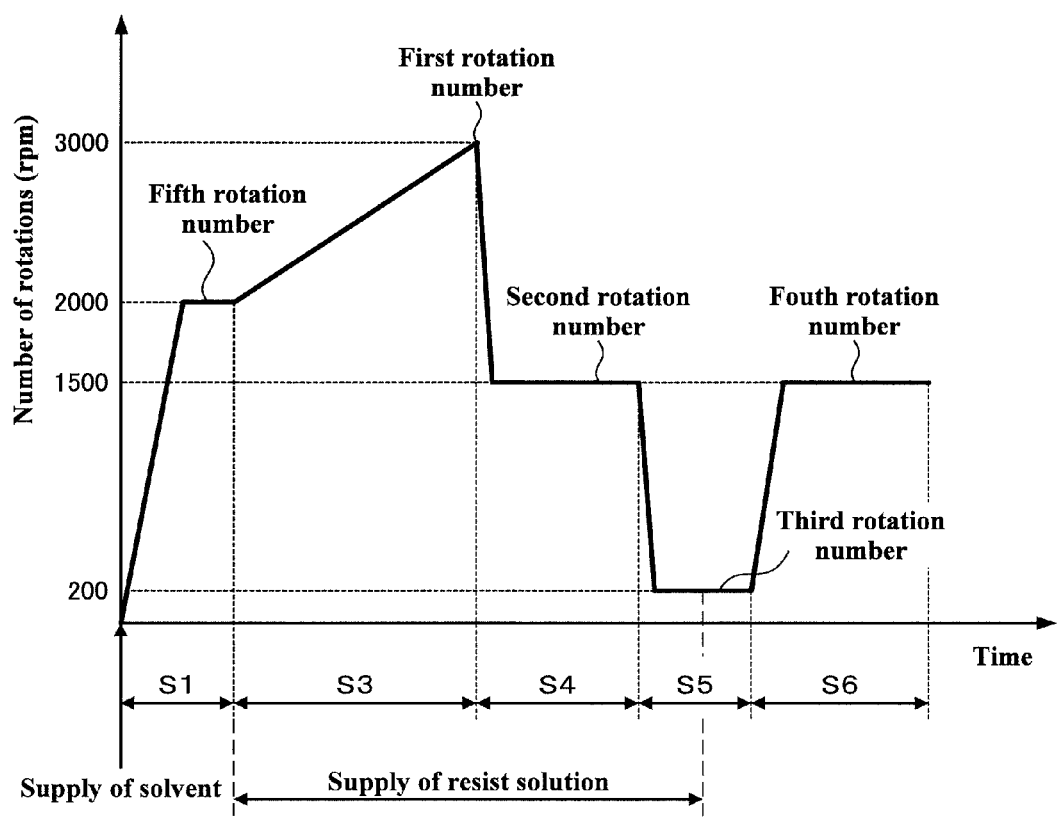
FIG. 13 is a graph showing the number of rotations of the wafer and supply timings of the resist solution and the solvent in each of the steps of the coating treatment process according to another embodiment.

Alternatively, the wafer W may be acceleratingly rotated such that the number of rotations of the wafer W is linearly varied from the fifth rotation number to the first rotation number in Step S3, for example, as shown in FIG. 13. In this event, the acceleration of the rotation of the wafer W is constant.

As described above, the number of rotations of the wafer W is accelerated at all times in Step S3 in both cases shown in FIG. 12 and FIG. 13, so that the resist solution R can be diffused more uniformly within the wafer while the supply amount of the resist solution R is suppressed to a small amount as described above.

Figure 14:
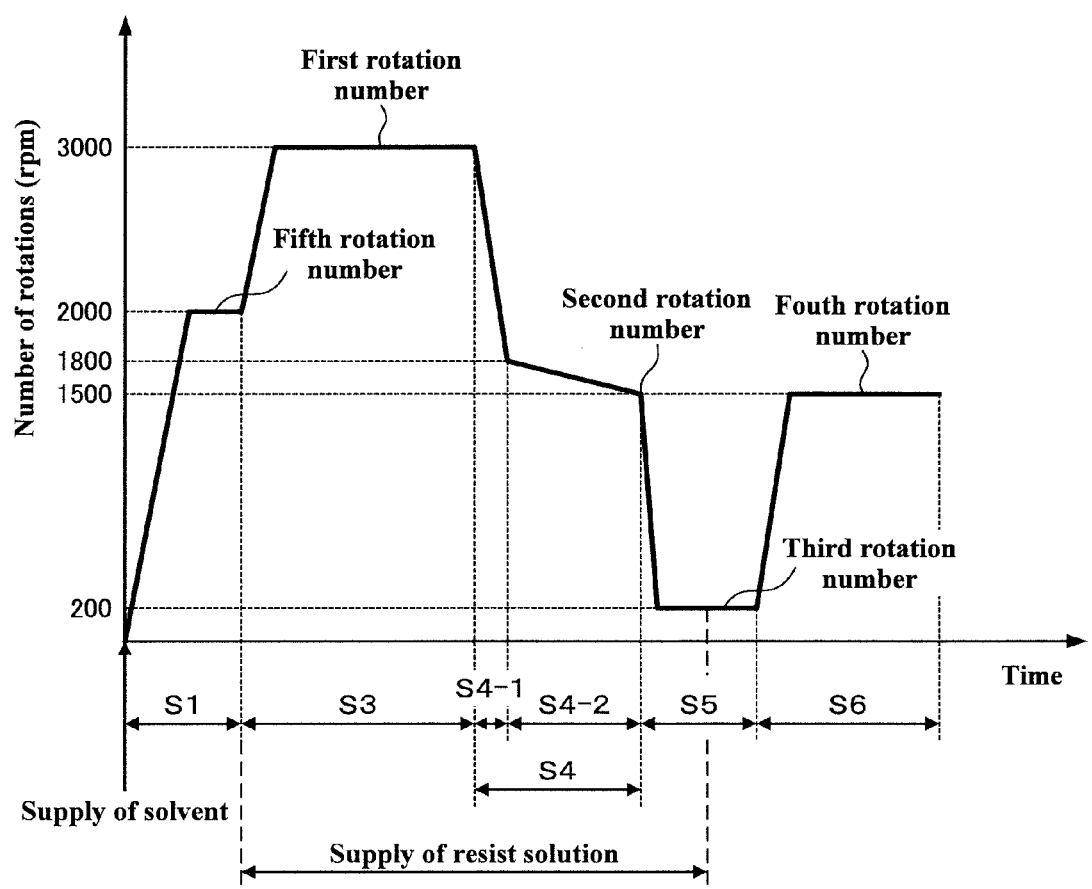
FIG. 14 is a graph showing the number of rotations of the wafer and supply timings of the resist solution and the solvent in each of the steps of the coating treatment process according to another embodiment.

The wafer W may be deceleratingly rotated at all timed as shown in FIG. 14 in Step S4 of the above embodiment. In Step S4, the rotation of the wafer W is decelerated from the first rotation number to, for example, 1800 rpm (Step S4-1 in FIG. 14). In this Step S4-1, the acceleration of the rotation of the wafer W is the fourth acceleration, for example, (−30000 rpm/s) to (−5000 rpm/s), more preferably, (−10000 rpm/s). Subsequently, the wafer W is deceleratingly rotated from 1800 rpm to the second rotation number (Step S4-2 in FIG. 14). In this Step S4-2, the acceleration of the rotation of wafer is the fifth acceleration, for example, (−500 rpm/s) or higher and lower than 0 rpm/s, higher than the fourth acceleration, more preferably, (−100 rpm/s).

In this case, since the wafer W is rotated at the second rotation number in Step S4, the resist solution R supplied on the wafer W in Step S3 can be diffused while drying of the resist solution R is suppressed. This makes the resist solution R supplied in Step S4 easily fit in the resist solution R supplied in Step S3, so that the resist solution R can be concentrically diffused on the wafer W. Accordingly, occurrence of a coating mottle of the resist solution R can be prevented and the resist solution R can be applied uniformly within the wafer.

The inventors verified the above-described effect capable of applying the resist solution R uniformly without causing a coating mottle on the wafer W. In the verification, as a comparative example, the resist solution R was applied on the wafer W using the conventional coating treatment method as in the comparative example shown in FIG. 7. More specifically, in the comparative example, the rotation of the wafer W was decelerated from the first rotation number to the third rotation number without passing through the second rotation number. The remaining coating recipe of the comparative example is the same as that of the coating recipe shown in FIG. 14. Note that in this verification, the verification was performed with the second rotation number set to 1800 rpm in the range of 1500 rpm to 2000 rpm. Then, in Step S4, the rotation of the wafer W is decelerated at the fourth acceleration from the first rotation number to 1830 rpm, and subsequently the rotation of the wafer W was decelerated at the fifth acceleration to the second rotation number. Further, in this verification, the above-described Step S2 was performed between Step S1 and Step S3 in FIG. 14 and the wafer W was rotated at the number of rotations of 500 rpm in Step S2.

Figure 15:
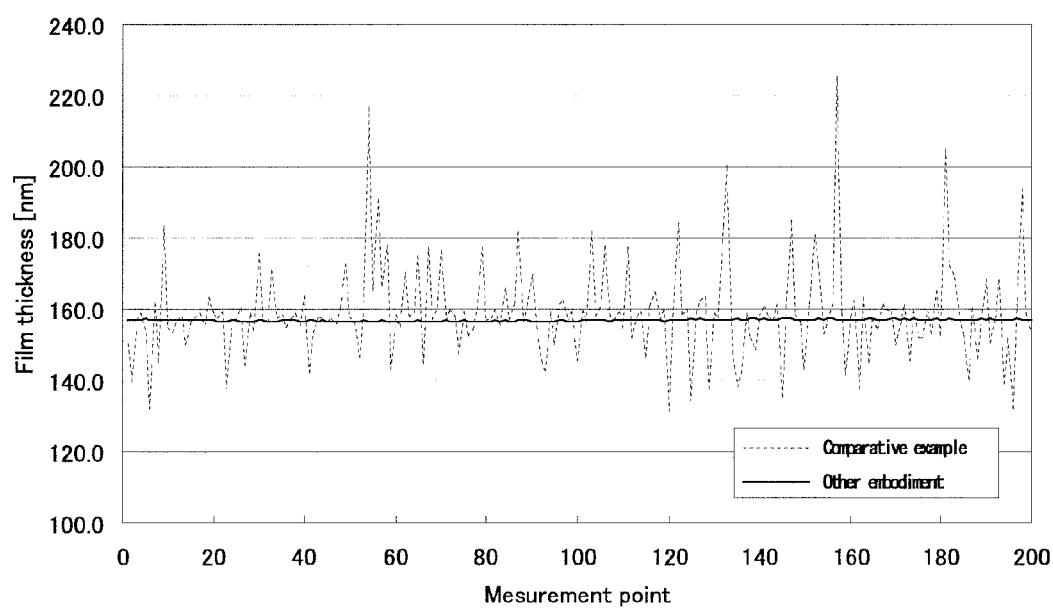
FIG. 15 is a graph showing the film thickness of the resist film on the outer peripheral portion of the wafer in another embodiment and a comparative example.

The result of the verification is shown in FIG. 15. The horizontal axis in FIG. 15 indicates the measurement point of the film thickness of the resist film. Specifically, a plurality of points on the outer peripheral portion of the wafer W were taken as the measurement points. The vertical axis in FIG. 15 indicates the film thickness of the resist film at each of the measurement points. Note that to distinguish from previously shown FIG. 7, the embodiment using the coating treatment method shown in FIG. 14 is referred to as an "other embodiment" in FIG. 15. Referring to FIG. 15, it was found that the film thickness of the resist film is non-uniform in the comparative example, whereas the film thickness of the resist film is uniform in the other embodiment. Accordingly, it was found that the resist solution R can be applied uniformly within the wafer without causing a coating mottle in the other embodiment, unlike the prior art.

Figure 16:
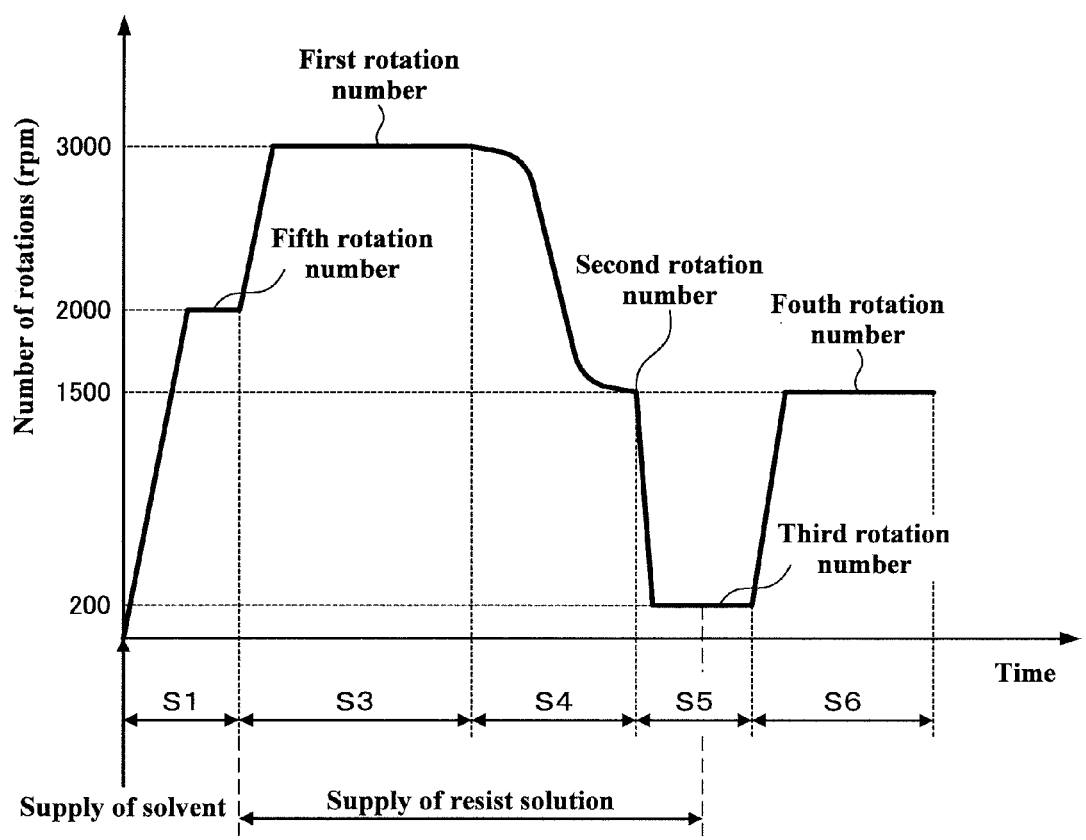
FIG. 16 is a graph showing the number of rotations of the wafer and supply timings of the resist solution and the solvent in each of the steps of the coating treatment process according to another embodiment.

Though the wafer W is deceleratingly rotated at all times in Step S4 in the above embodiment, the method of deceleratingly rotating the wafer W is not limited to the method shown in FIG. 14. For example, as shown in FIG. 16, the wafer W may be deceleratingly rotated such that the number of rotations of the wafer W is varied in an S-shape from the first rotation number to the second rotation number in Step S4. In other words, the rotation of the wafer W at the first rotation number is gradually decelerated such that the number of rotations thereafter is continuously and smoothly varied. In this event, the acceleration of the rotation of the wafer W is gradually decreased, for example, from zero. Then, at the end of Step S4, the acceleration of the rotation of the wafer W is gradually increased and the number of rotations of the wafer W smoothly converges to the second rotation number.

Figure 17:
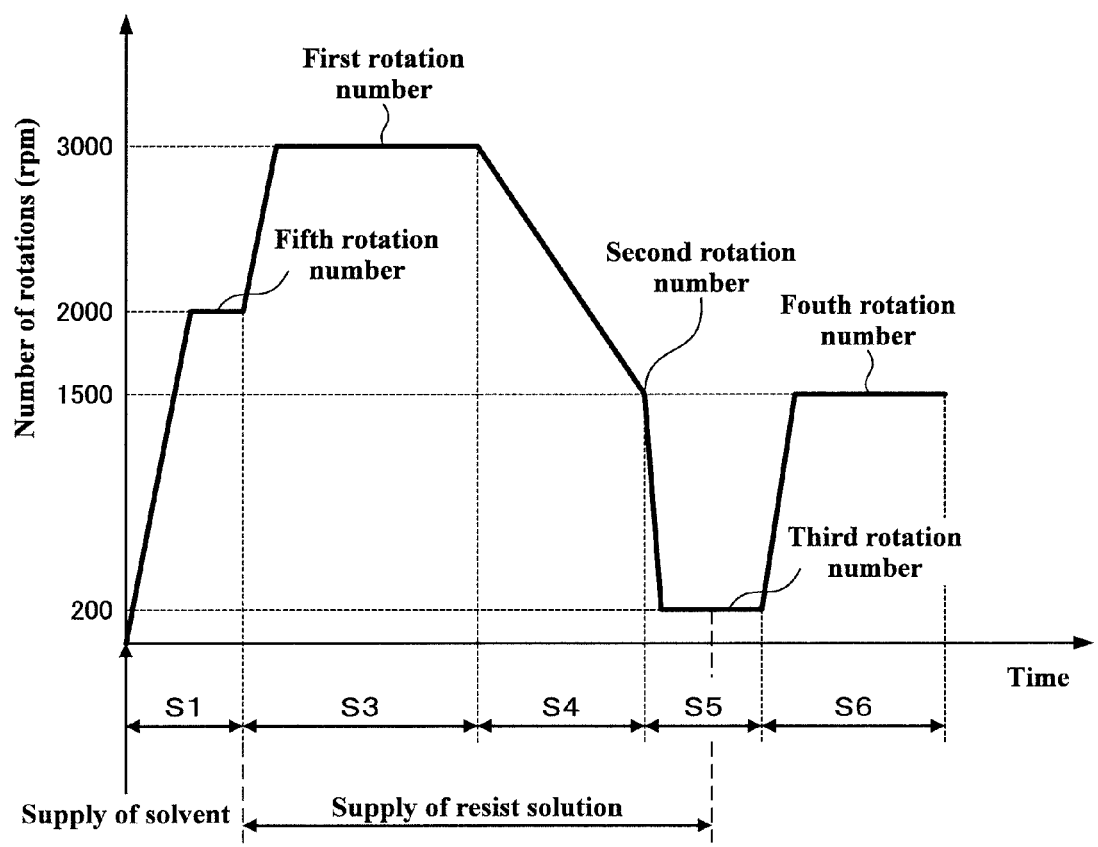
FIG. 17 is a graph showing the number of rotations of the wafer and supply timings of the resist solution and the solvent in each of the steps of the coating treatment process according to another embodiment.
Figure 18:
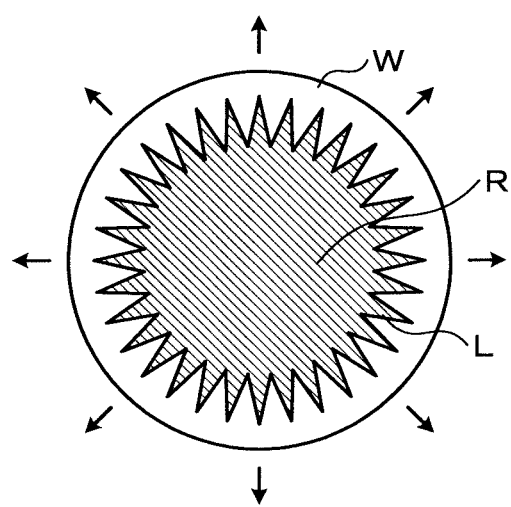
FIG. 18 is an explanatory view showing the appearance of the resist solution diffusing on the wafer in the case using the conventional coating treatment method.

Alternatively, the wafer W may be deceleratingly rotated such that the number of rotations of the wafer W is linearly varied from the first rotation number to the second rotation number in Step S4, for example, as shown in FIG. 17. In this event, the acceleration of the rotation of the wafer W is constant.

As described above, the wafer W is rotated at the second rotation number in Step S4 in both cases shown in FIG. 16 and FIG. 17, so that occurrence of a coating mottle of the resist solution R can be prevented and the resist solution R can be applied uniformly within the wafer as described above.

Hitherto, the preferred embodiments of the present invention are described with reference to the accompanying drawings, but the present invention is not limited to such embodiments. It is obvious that those skilled in the art could come up with various modified examples and corrected examples within the scope of the idea described in the claims, and it should be understood that these examples naturally belong to the technical scope of the present invention. The present invention can employ not only these examples but also various modes. For example, the above embodiment describes, as an example, the coating treatment of the resist solution, and the present invention is also applicable to the coating treatment of coating solutions other than the resist solution, such as coating solutions for forming an anti-reflection film, a SOG (Spin On Glass) film, a SOD (Spin On Dielectric) film, and the like. Further, the above embodiments describe examples of performing the coating treatment on the wafer. The present invention is also applicable to coating treatment for substrates other than the wafer, such as, for example, substrates of a FPD (flat panel display) and a photomask mask reticle.

What is claimed is:

1. A coating treatment method of applying a coating solution on a substrate, comprising:
    a first step of rotating the substrate at a first rotation number;
    a second step of subsequently decelerating the rotation of the substrate and rotating the substrate at a second rotation number lower than the first rotation number;
    a third step of subsequently further decelerating the rotation of the substrate and rotating the substrate at a third rotation number lower than the second rotation number; and
    a fourth step of subsequently accelerating the rotation of the substrate and rotating the substrate at a fourth rotation number higher than the third rotation number,
    wherein supply of the coating solution to a center portion of the substrate is continuously performed from said first step to a middle of said third step,
    wherein the second rotation number is 1500 rpm to 2000 rpm,
    wherein in said second step, the rotation of the substrate at the second rotation number is performed for 0.4 seconds or longer,
    wherein the coating treating method further comprises, before said first step, a fifth step of rotating the substrate at a fifth rotation number lower than the first rotation number, and
    wherein in said fifth step, a solvent for the coating solution is supplied to the substrate, and the solvent is applied on the substrate while the substrate is rotated at the fifth rotation number.

2. The coating treatment method as set forth in claim 1, wherein in said first step, the substrate is acceleratingly rotated from the fifth rotation number to the first rotation number while an acceleration of the rotation of the substrate is set constant.

3. The coating treatment method as set forth in claim 1, wherein in said first step, a contact angle of the coating solution on the substrate is 85 degrees or larger.

\* \* \* \* \*